(12) United States Patent
Luo

(10) Patent No.: US 10,985,194 B2
(45) Date of Patent: Apr. 20, 2021

(54) DISPLAY PANEL AND DISPLAY DEVICE

(71) Applicant: XIAMEN TIANMA MICRO-ELECTRONICS CO., LTD., Xiamen (CN)

(72) Inventor: Xiaodong Luo, Xiamen (CN)

(73) Assignee: XIAMEN TIANMA MICRO-ELECTRONICS CO., LTD., Xiamen (CN)

(*) Notice: Subject to any disclaimer, the term of this patent is extended or adjusted under 35 U.S.C. 154(b) by 0 days.

(21) Appl. No.: 16/435,793

(22) Filed: Jun. 10, 2019

(65) Prior Publication Data
US 2020/0194468 A1 Jun. 18, 2020

(30) Foreign Application Priority Data
Dec. 13, 2018 (CN) .......................... 201811523988.4

(51) Int. Cl.
H01L 27/12 (2006.01)
(52) U.S. Cl.
CPC ................................. H01L 27/1244 (2013.01)
(58) Field of Classification Search
CPC .................................................... H01L 27/1244
See application file for complete search history.

(56) References Cited

U.S. PATENT DOCUMENTS

2015/0228706 A1* 8/2015 Lee ...................... G02F 1/13452
257/88
2020/0013330 A1* 1/2020 Kim ...................... H01L 51/5237

FOREIGN PATENT DOCUMENTS

CN 206301124 U 7/2017

* cited by examiner

Primary Examiner — Moazzam Hossain
(74) Attorney, Agent, or Firm — Anova Law Group PLLC

(57) ABSTRACT

A display panel and a display device are provided. The display panel comprises a display area; a non-display area surrounding the display area; a first edge; and a first insulating layer. The non-display area includes a binding area disposed between the display area and the first edge, and the binding area includes a plurality of bonding pads. The first insulating layer includes a plurality of through-holes disposed at the binding area and one-to-one corresponding the plurality of bonding pads, and a through-hole at least partially exposes a corresponding bonding pad. The first insulating layer includes a sub-edge arranged adjacent to the first edge, and a distance between the sub-edge and the first edge is D1, and the bonding pad has a first bonding pad edge arranged adjacent to the first edge, and a distance between the first bonding pad edge and the first edge is D2, where D1≥D2.

19 Claims, 15 Drawing Sheets

DISPLAY PANEL AND DISPLAY DEVICE

CROSS-REFERENCES TO RELATED APPLICATIONS

This application claims the priority of Chinese Patent Application No. CN201811523988.4, filed on Dec. 13, 2018, the entire contents of all of which are incorporated herein by reference.

FIELD OF THE DISCLOSURE

The present disclosure generally relates to the display technology and, more particularly, relates to a display panel and a display device thereof.

BACKGROUND

With the development of display technology, display devices have become an essential part of consumers' daily lives, and are developing in the direction of narrow frame and high screen-to-body ratio to achieve full-screen display. Narrow frame is achieved by further compressing the width of the frame area, thereby expanding the active area (AA). Narrow frame poses a higher challenge to the design and manufacture of display devices.

In the design of the display device, an integrated circuit (IC) is disposed in the display panel. To reduce the frame area occupied by the IC, a technology of Chip on Film has been proposed in the prior art. Through fixing the IC on the flexible printed circuit then fixing the flexible printed circuit on the display panel, the position of the IC at the display panel may be omitted and the lower frame may be narrowed.

However, display panels which are manufactured using COF technology often have an issue that the flexible printed circuit is not firmly fixed, resulting in failure of the electrical connection between the flexible printed circuit and the display panel, and degrading the reliability of the display panel. Thus, display panels and display devices manufactured using COF technology but with enhanced reliability are highly desired. The disclosed display panel and display device thereof are directed to solve one or more problems set forth above and other problems.

BRIEF SUMMARY OF THE DISCLOSURE

One aspect of the present disclosure provides a display panel. The display panel comprises a display area; a non-display area surrounding the display area; a first edge; and a first insulating layer. The non-display area includes a binding area disposed between the display area and the first edge, and the binding area includes a plurality of bonding pads. The first insulating layer includes a plurality of through-holes disposed at the binding area and one-to-one corresponding the plurality of bonding pads, and a through-hole at least partially exposes a corresponding bonding pad. The first insulating layer includes a sub-edge arranged adjacent to the first edge, and a distance between the sub-edge and the first edge is D1, and the bonding pad has a first bonding pad edge arranged adjacent to the first edge, and a distance between the first bonding pad edge and the first edge is D1, where D1≥D2.

Another aspect of the present disclosure provides a display device. The display device comprises a display panel. The display panel comprises a display area; a non-display area surrounding the display area; a first edge; and a first insulating layer. The non-display area includes a binding area disposed between the display area and the first edge, and the binding area includes a plurality of bonding pads. The first insulating layer includes a plurality of through-holes disposed at the binding area and one-to-one corresponding the plurality of bonding pads, and a through-hole at least partially exposes a corresponding bonding pad. The first insulating layer includes a sub-edge arranged adjacent to the first edge, and a distance between the sub-edge and the first edge is D1, and the bonding pad has a first bonding pad edge arranged adjacent to the first edge, and a distance between the first bonding pad edge and the first edge is D1, where D1≥D2.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which may be illustrated in the accompanying drawings. Hereinafter, embodiments consistent with the disclosure will be described with reference to drawings. Wherever possible, the same reference numbers will be used throughout the drawings to refer to the same or like parts. It may be apparent that the described embodiments may be some but not all of the embodiments of the present disclosure. Based on the disclosed embodiments, persons of ordinary skill in the art may derive other embodiments consistent with the present disclosure, all of which may be within the scope of the present disclosure. Further, in the present disclosure, the disclosed embodiments and the features of the disclosed embodiments may be combined under conditions without conflicts.

Figure 1:
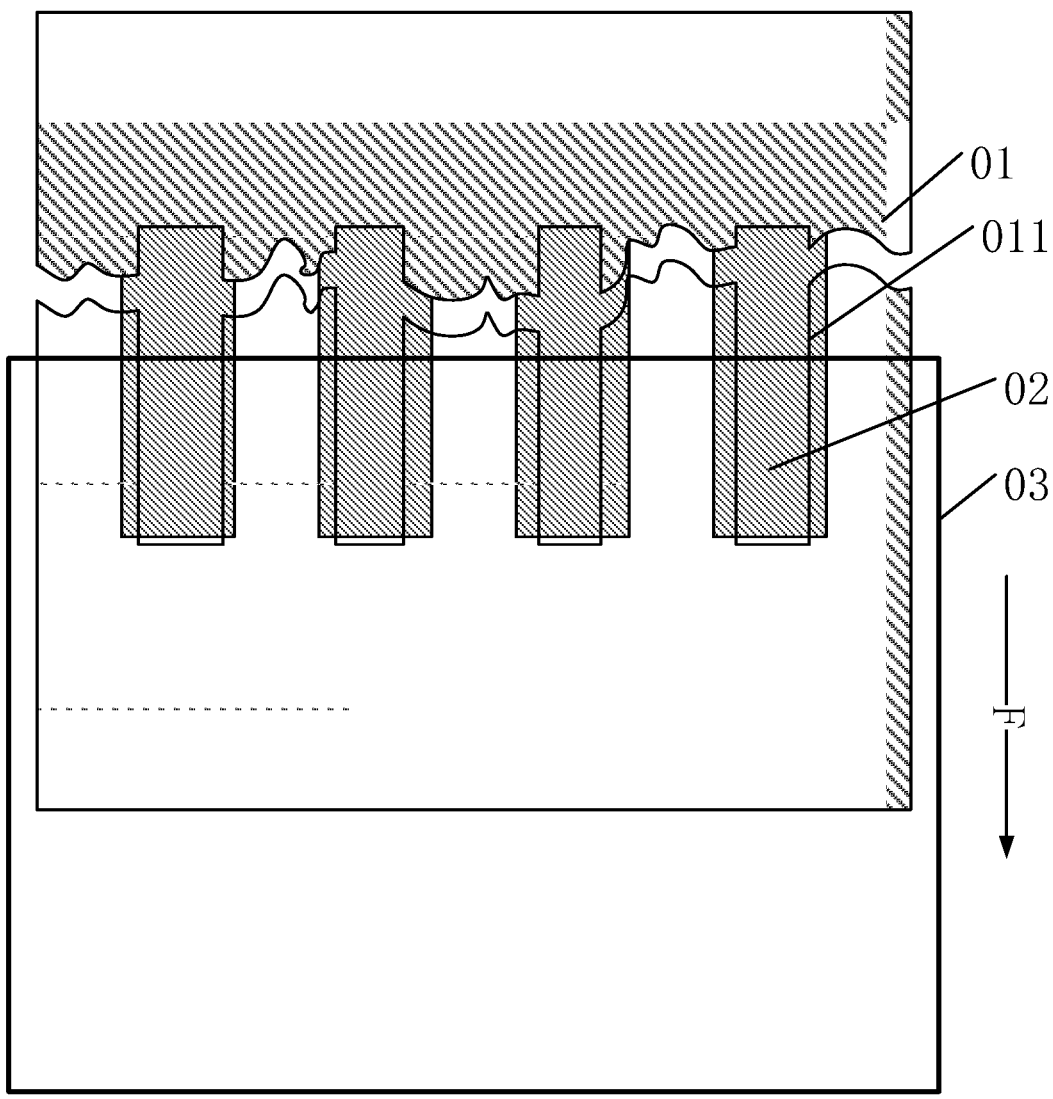
FIG. 1 illustrates a partial schematic top view of a binding area of an existing display panel.

FIG. 1 illustrates a schematic top view of a partial binding area of an existing display panel. As shown in FIG. 1, the binding area is provided with an insulating layer 01 and a plurality of bonding pads 02, and the insulating layer 01 is provided with a plurality of hollows 011. The hollow 011 exposes a portion of the bonding pad 02. A flexible printed circuit 03 is electrically connected to the bonding pad 02 through a conductive adhesive (not drawn in FIG. 1).

Because the conductive adhesive has fluidity and the process accuracy of coating the conductive adhesive is difficult to be precisely controlled, the insulating layer 01 at the lower part of the bonding pad 02 is often adhered with the conductive adhesive, and the insulating layer 01 at the lower part of the bonding pad 02 is tightly bonded to the flexible printed circuit 03. When subjected to an external force F, the flexible printed circuit 03 may pull the insulation layer 01, causing the insulation layer 01 to crack or even peel off. Correspondingly, the flexible printed circuit 03 is moved together with the insulation layer 01, thereby causing an issue that the flexible printed circuit is not firmly fixed.

To solve the above-mentioned technical problems and other problems, the present disclosure provides a display panel and a display device thereof.

Figure 2:
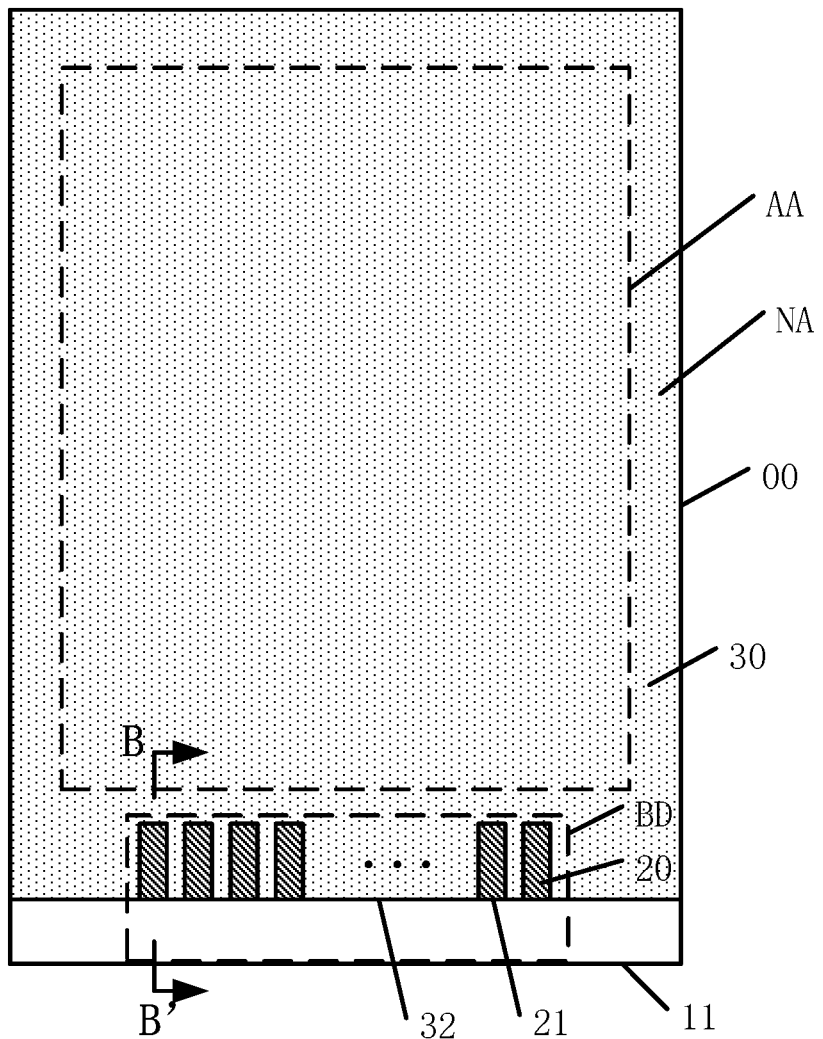
FIG. 2 illustrates a schematic top view of an exemplary display panel consistent with the disclosed embodiments.
Figure 3:
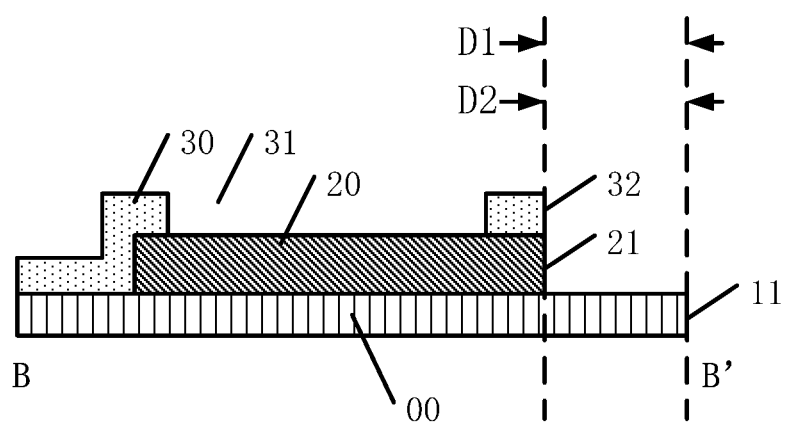
FIG. 3 illustrates a BB'-sectional view of an exemplary display panel in FIG. 3 consistent with the disclosed embodiments.

FIG. 2 illustrates a schematic top view of an exemplary display panel consistent with the disclosed embodiments, and FIG. 3 illustrates a BB'-sectional view of an exemplary display panel in FIG. 3 consistent with the disclosed embodiments. As shown in FIGS. 2-3, the display panel may include a display area AA, a non-display area NA surrounding the display area AA, a first edge 11 and a first insulating layer 30. The non-display area NA may include a binding area BD disposed between the display area AA and the first edge 11. The binding area BD may include a plurality of bonding pads 20. The first insulating layer 30 may include a plurality of through-holes 31 disposed at the binding area BD. The plurality of through-holes 31 may be one-to-one corresponding the plurality of bonding pads 20, and the through-hole 31 may expose at least a portion of the bonding pad 20. That is, the through-hole 31 may at least partially expose the bonding pad 20.

The first insulating layer 30 may include a sub-edge 32 arranged close to/adjacent to the first edge 11, and a distance between the sub-edge 32 and the first edge 11 is D1. The bonding pad 20 may have a first bonding pad edge 21 arranged close to/adjacent to the first edge 11, and a distance between the first bonding pad edge 21 and the first edge 11 is D1, where D1≥D2.

Figure 4:
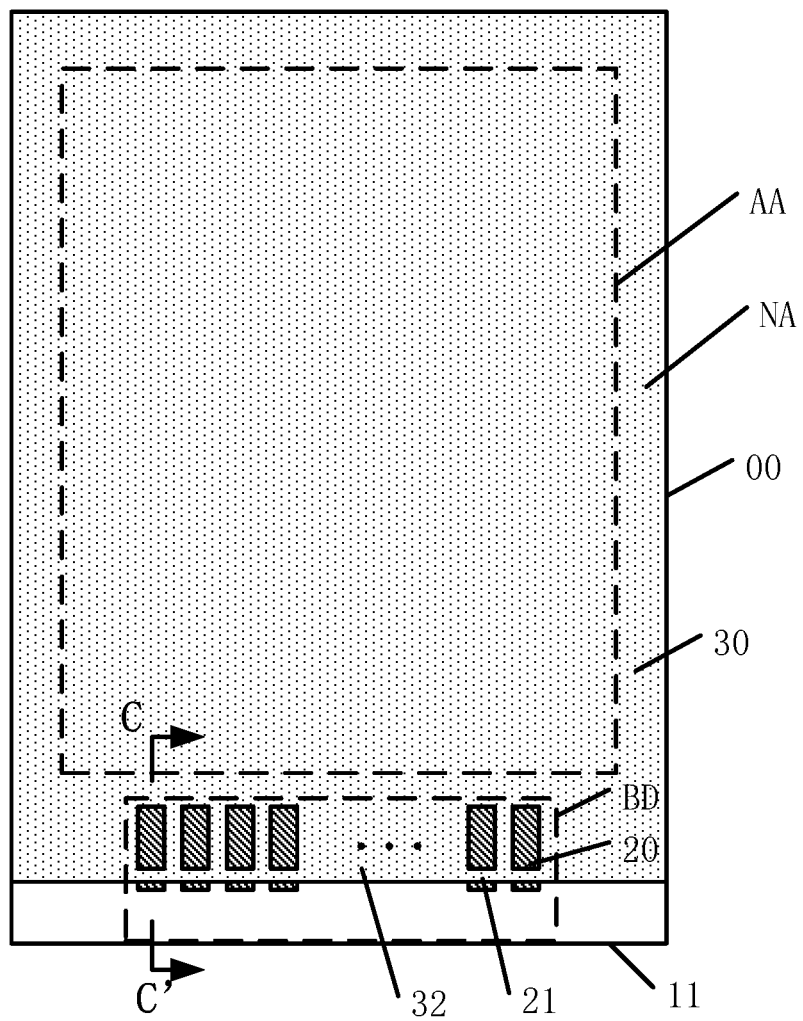
FIG. 4 illustrates a schematic top view of another exemplary display panel consistent with the disclosed embodiments.
Figure 5:
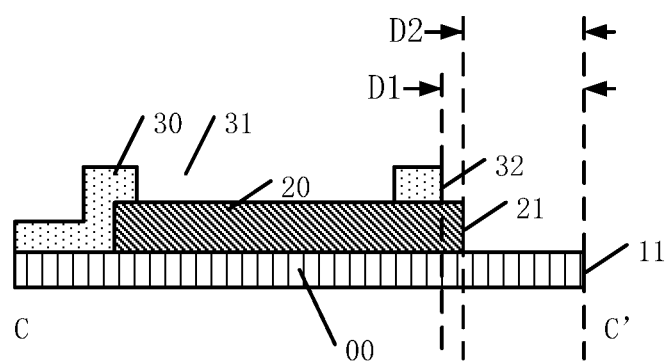
FIG. 5 illustrates a CC'-sectional view of an exemplary display panel in FIG. 4 consistent with the disclosed embodiments.

For illustrative purposes, FIGS. 2-3 show a display panel where D1=D2, while FIGS. 4-5 show a display panel where D1>D2. FIG. 4 illustrates a schematic top view of another exemplary display panel consistent with the disclosed embodiments, and FIG. 5 illustrates a CC'-sectional view of an exemplary display panel in FIG. 4 consistent with the disclosed embodiments. The difference between FIGS. 2-3 and FIGS. 4-5 is that in the display panel shown in FIGS. 4-5, D1>D2.

In the disclosed embodiments, the display area AA may have a function of displaying image information. For example, the display area AA may include a plurality of pixels (not drawn), and the non-display NA may not have a display function and configured to be disposed with, for example, circuit traces, electronic components, etc.

Returning to FIGS. 2-3, the display panel may include the first edge 11, which is often referred to as a lower edge. The display area AA may have a first side close to the first edge 11 and an opposing second side, and the binding area BD may be disposed at the first side of the display area AA, and a portion of the non-display area where the portion of the non-display area is disposed between the display area AA and the first edge 11 is often referred as a lower frame.

The plurality of bonding pads 20 may be disposed at the binding area BD. The material of the bonding pads 20 may include a metal material having good conductivity, and a part of the wirings (not drawn) in the display panel may be electrically connected to the bonding pads 20.

The display panel may include the first insulating layer 30 which is electrically insulated. It is understood that a plurality of conductive layers and a plurality of insulating layers are often disposed in the display panel. For example, the bonding pads may be disposed at the conductive layer, and the conductive layers may be separated by the insulating layer to achieve mutual insulation. The display panel may further include a base substrate 00. The bonding pad 20 may have a first surface facing the base substrate 00 and an opposing second surface, and the first insulating layer 30 may be disposed at the second surface of the bonding pad 20.

On one hand, the first insulating layer 20 is electrically insulated, which may avoid unnecessary electrical connection between the bonding pad 20 and other structures in the display panel. On the other hand, the first insulating layer 20 may provide a protective function to prevent air, and impurities, etc. from entering the inside of the display panel to cause damage to the display panel. The first insulating layer 20 may include an organic material and/or an inorganic material, which is not limited by the present disclosure.

The plurality of through-holes 31 may be disposed at the first insulating layer 30, and may be one-to-one corresponding to plurality of bonding pads 20. In other words, a corresponding through-hole 31 may be disposed at the second surface of each bonding pad 20 (i.e., the surface of the bonding pad far away from the base substrate) and expose least a portion of each bonding pad 20. For the same bonding pad 20, the second surface of the bonding pad 20 (i.e., the surface of the bonding pad far away from the base substrate) may be completely exposed by the through-hole 31, or may be partially exposed by the through-hole 31. Through disposing the plurality of through-holes 31 at the first insulating layer 30, the electrical connection between the bonding pads 20 and the flexible printed circuit (not drawn) may be realized. For illustrative purposes, FIG. 3 shows the second surface of the bonding pad 20 (i.e., the surface of the bonding pad far away from the base substrate) may be partially exposed by the through-hole 31.

The first insulating layer 30 may include the sub-edge 32 arranged close to the first edge 11, and the distance between the sub-edge 32 and the first edge 11 is D1. The bonding pad 20 may have the first bonding pad edge 21 arranged close to the first edge 11, and the distance between the first bonding pad edge 21 and the first edge 11 is D1, where D1≥D2. That is, the first bonding pad edge 21 and the sub-edge 32 may be flush, or the sub-edge 32 of the first insulating layer 30 may be closer to the display area AA than the first bonding pad edge 21 of the bonding pad 20 is. In other words, in the disclosed display panel, the first insulating layer 30 may be retracted at the lower frame, and the sub-edge 32 of the first insulating layer 30 may be no longer arranged at a first side of the first bonding pad edge 21 in which the first side is disposed close to the first edge 11.

When the display panel is implemented with the COF technology, the flexible printed circuit and the bonding pad 20 may be electrically connected by the conductive adhesive. Even when the conductive adhesive has fluidity, the accuracy of the coating process accuracy is difficult to be accurately controlled, and the conductive adhesive is adhered to the lower frame, the contact area of the first insulating layer 30 and the flexible printed circuit may be substantially small due to the retracted design of the first insulating layer. Thus, after being subjected to an external force, the flexible printed circuit may have less influence on the first insulating layer 30, and the peeling off of the first insulating layer 30 may be suppressed.

In the disclosed embodiments, the display panel may include the first insulating layer 30 which includes the plurality of through-holes 31 configured to expose at least a portion of the bonding pads 20. The first insulating layer 30 may be configured with a retracted design. In particular, the first insulating layer 30 may include the sub-edge 32 arranged close to the first edge 11, and the distance between the sub-edge 32 and the first edge 11 is D1. The bonding pad 20 may have the first bonding pad edge 21 arranged close to the first edge 11, and the distance between the first bonding pad edge 21 and the first edge 11 is D1, where D1≥D2. That is, the first bonding pad edge 21 and the sub-edge 32 may be flush, or the sub-edge 32 of the first insulating layer 30 may be closer to the display area AA than the first bonding pad edge 21 of the bonding pad 20 is.

When the display panel is implemented with the COF technology, the contact area of the first insulating layer 30 and the flexible printed circuit may be substantially small as compared to existing technology. Thus, the phenomenon that the first insulating layer 30 is peeled off may be improved, the phenomenon that the flexible printed circuit is not fixed firmly may be improved, the electrical connection between the flexible printed circuit and the display panel may be improved, and the reliability of the display panel may be enhanced.

Figure 6:
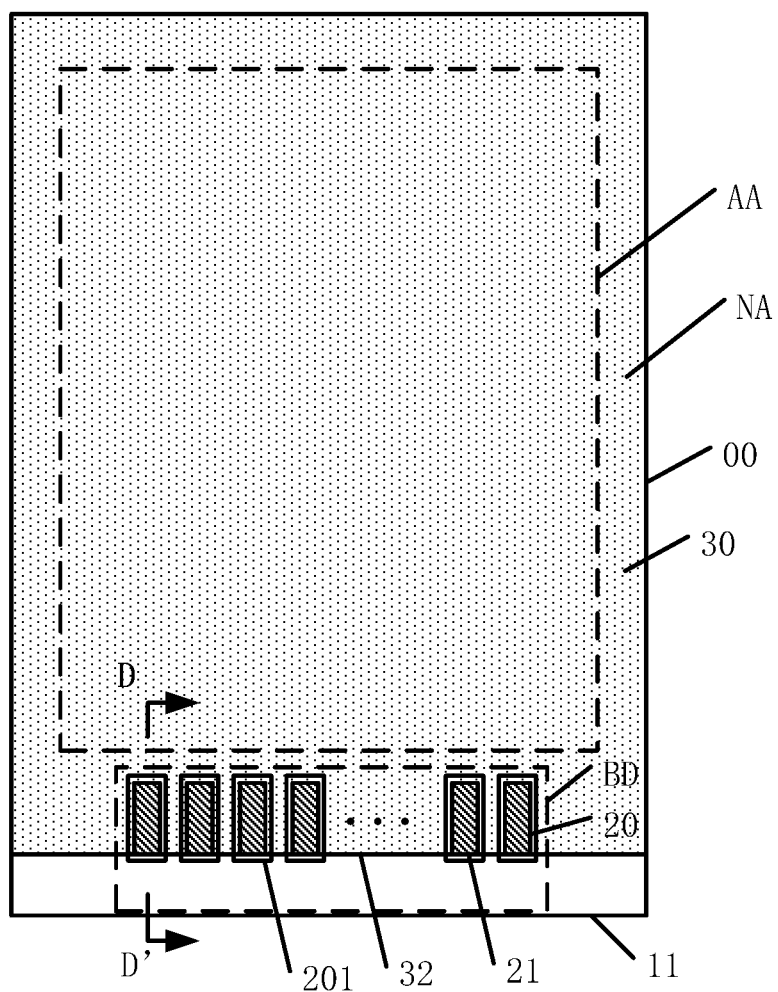
FIG. 6 illustrates a schematic top view of another exemplary display panel consistent with the disclosed embodiments.
Figure 7:
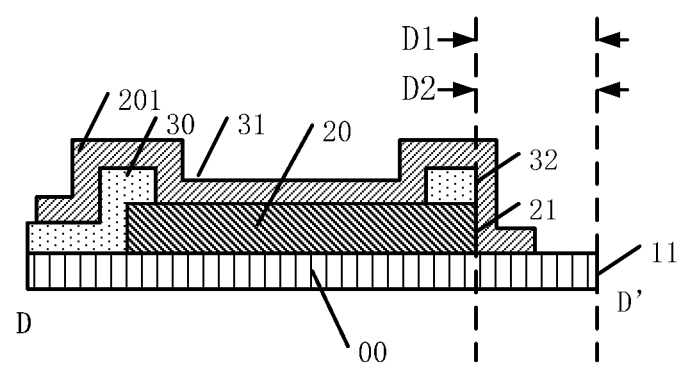
FIG. 7 illustrates a DD'-sectional view of an exemplary display panel in FIG. 6 consistent with the disclosed embodiments.

FIG. 6 illustrates a schematic top view of another exemplary display panel consistent with the disclosed embodiments, and FIG. 7 illustrates a DD'-sectional view of an exemplary display panel in FIG. 6 consistent with the disclosed embodiments. The similarities between FIGS. 2-3 and FIGS. 6-7 are not repeated while certain difference may be explained.

As shown in FIGS. 6-7, the binding area BD may include a plurality of conductive portions 201 which are one-to-one corresponding to the plurality of bonding pads 20. The conductive portion 201 and the corresponding bonding pad 20 may be electrically connected through the through-hole 31.

In the disclosed embodiments, the plurality of conductive portions 201 may be disposed at the second side of the bonding pad 20 (i.e., the side far away from the base substrate 00). The plurality of conductive portions 201 may be one-to-one corresponding to the plurality of bonding pads 20, and one conductive portion 201 may be electrically connected to the corresponding bonding pad 20. The conductive portion 20 may cover a portion of the bonding pad 20 in which the portion is exposed by the through-hole 31. In other words, the conductive portion 20 may cover a portion of the second surface of the bonding pad 20 in which the portion of the second surface of the bonding pad 20 is exposed by the through-hole 31. As described above, the second surface of the bonding pad 20 (i.e., the surface of the bonding pad far away from the base substrate) may be completely exposed by the through-hole 31, or may be partially exposed by the through-hole 31.

The material of the conductive portion 201 may include a metal material or a metal oxide material. In one embodiment, the material of the conductive portion 201 may include any one of indium gallium zinc oxide (IGZO), indium zinc oxide (IZO), indium tin oxide (ITO), and indium tin zinc oxide (ITZO). IGZO, IZO, ITO and ITZO are commonly used materials for fabricating electrodes in display panels, and the manufacturing process is relatively mature, such that the difficulty and cost of manufacturing the display panel may be reduced.

In the disclosed embodiments, the conductive portion 201 may serve as a connector to reduce the distance between the flexible printed circuit and the bonding pad 20. In addition, due to the excellent electrical connection between the conductive portion 201 and the conductive adhesive, the electrical connection between the flexible printed circuit and the bonding pad 20 may be enhanced.

In the disclosed embodiments, the retracting structure of the first insulating layer may be realized in various way. Certain exemplary retracting structures of the first insulating layer will be explained below.

Figure 8:
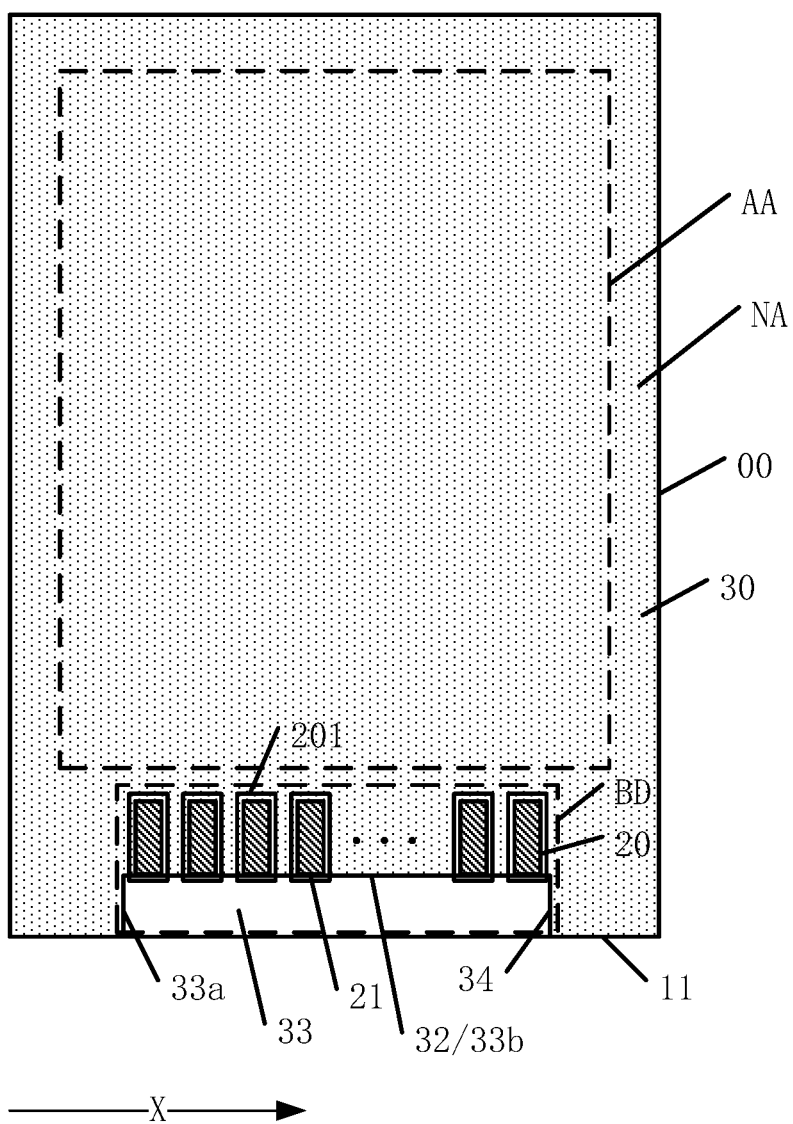
FIG. 8 illustrates a schematic top view of another exemplary display panel consistent with the disclosed embodiments.

FIG. 8 illustrates a schematic top view of another exemplary display panel consistent with the disclosed embodiments. As shown in FIG. 8, the first insulating layer 30 may include a groove 33. The first insulating layer 30 may include an irregular-shaped edge 34 arranged close to the first edge 11, and the irregular-shaped edge 34 may be recessed toward the inside of the display panel to form the groove 33. The irregular-shaped edge 34 may include the sub-edge 32.

In the disclosed embodiments, the first insulating layer 30 may be provided with the groove 33 at the lower frame, and the groove 33 may penetrate the first insulating layer along the thickness direction of the first insulating layer 30. In particular, the first insulating layer 30 may include the irregular-shaped edge 34 arranged close to the first edge 11, and the irregular-shaped edge 34 may be recessed toward the inside of the display panel to form the groove 33. The groove 33 may include a sidewall 33a and a bottom 33b, and the sub-edge 32 may be the bottom 33b of the groove 33.

Along a first direction X, the first insulating layer 30 may be retained on both sides of the groove 33, i.e., the lower frame of the display panel may partially retain the first insulating layer 30. Because the display panel is provided with conductive structures such as wires, circuit elements and the like on both sides of the groove 33 in the first direction X, the retained first insulating layer 30 may protect the conductive structures and provide electrical insulation between the conductive layers.

Figure 9:
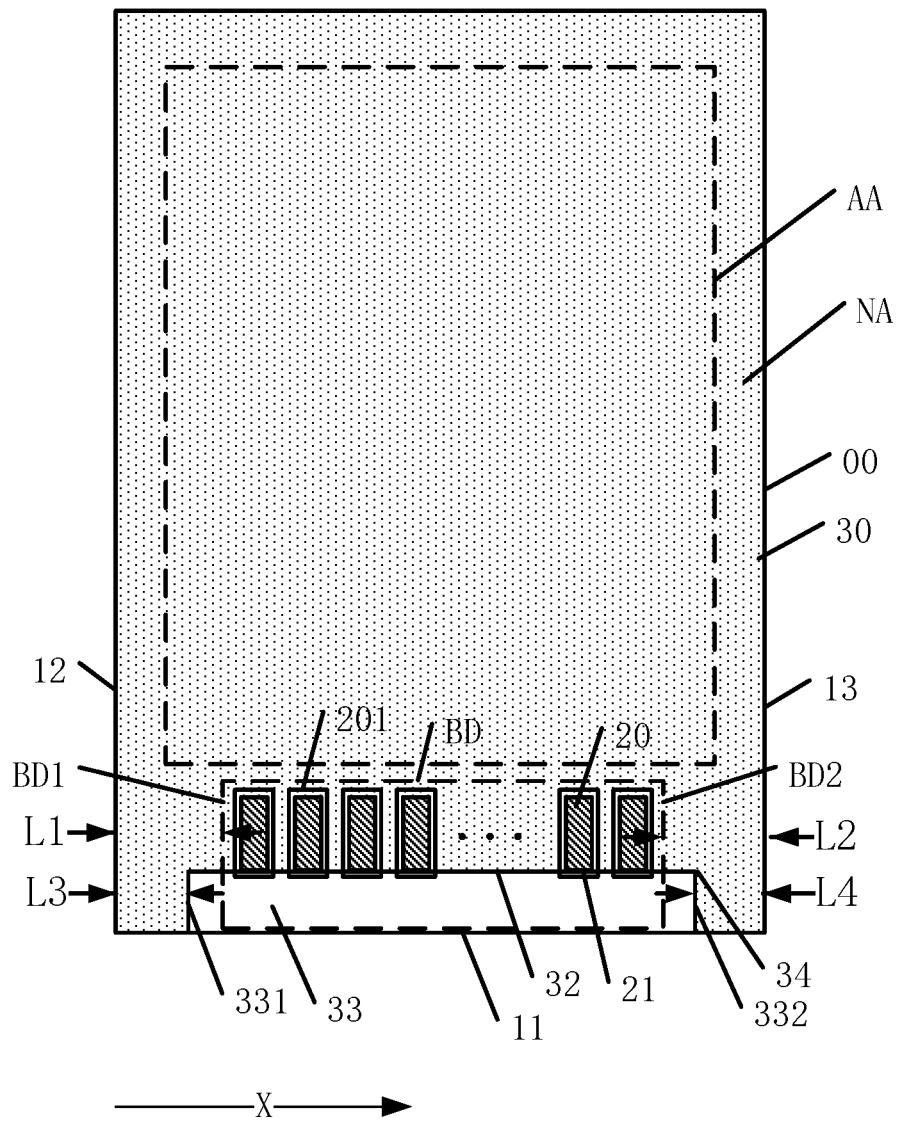
FIG. 9 illustrates a schematic top view of another exemplary display panel consistent with the disclosed embodiments.

FIG. 9 illustrates a schematic top view of another exemplary display panel consistent with the disclosed embodiments. As shown in FIG. 9, the display panel may include a second edge 12 and a third edge 13 disposed opposite to each other in the first direction X, and the binding area BD may extend along the first direction X. The binding area BD may have a first binding edge BD1 close to/adjacent to the second edge 12 and a second binding edge BD2 close to/adjacent to the third edge 13. The distance between the first binding edge BD1 and the second edge 12 is L1, and the distance between the second binding edge BD2 and the third edge 13 is L2. The groove 33 may have a first groove edge 331 close to/adjacent to the second edge 12, and a second groove edge 332 close to/adjacent to the third edge 13. The distance between the first groove edge 331 and the second edge 12 is L3, the distance between the second groove edge 332 and the third edge 13 is L4, where L1<L3 and L2<L4.

In the disclosed embodiments, the second edge 12 and the third edge 13 may be arranged on opposite sides of the display area AA along the first direction X, and the binding area BD may have a striped-shape extending along the first direction X. Along the first direction X, the length of the groove 33 may be greater than the length of the binding area BD. In particular, the distance L1 between the first binding edge BD1 and the second edge 12 may be smaller than the distance L3 between the first groove edge 331 and the second edge 12, and the distance L2 between the second binding edge BD2 and the third edge 13 may be smaller than the distance L4 between the second groove edge 332 and the third edge 13. In other words, along the first direction X, the groove 33 may extend beyond the range of the binding area BD.

In the disclosed embodiments, the groove 33 may be lengthened. The width of the flexible printed circuit is often larger than the length of the binding area BD in the first direction X, in some embodiments, the length of the groove 33 in the first direction X may be configured to be greater than the width of the flexible printed circuit. Through lengthening the groove 33 in the first direction X, the flexible printed circuit may be prevented from being bonded to the first insulating layer 30 at both sides of the binding area BD along the first direction X, such that the contact area of the first insulating layer 30 and the flexible printed circuit may be further reduced. Thus. the phenomenon that the first insulating layer 30 is peeled off may be improved, the phenomenon that the flexible printed circuit is not fixed firmly may be improved, the electrical connection between the flexible printed circuit and the display panel may be improved, and the reliability of the display panel may be enhanced.

It should be noted that, for illustrative purposes, FIG. 8 and FIG. 9 show that in a top view the groove 33 has a rectangular shape. In another embodiment, the groove 33 may be a rounded rectangle, a trapezoid or other irregular pattern, which is not limited by the present disclosure.

Figure 10:
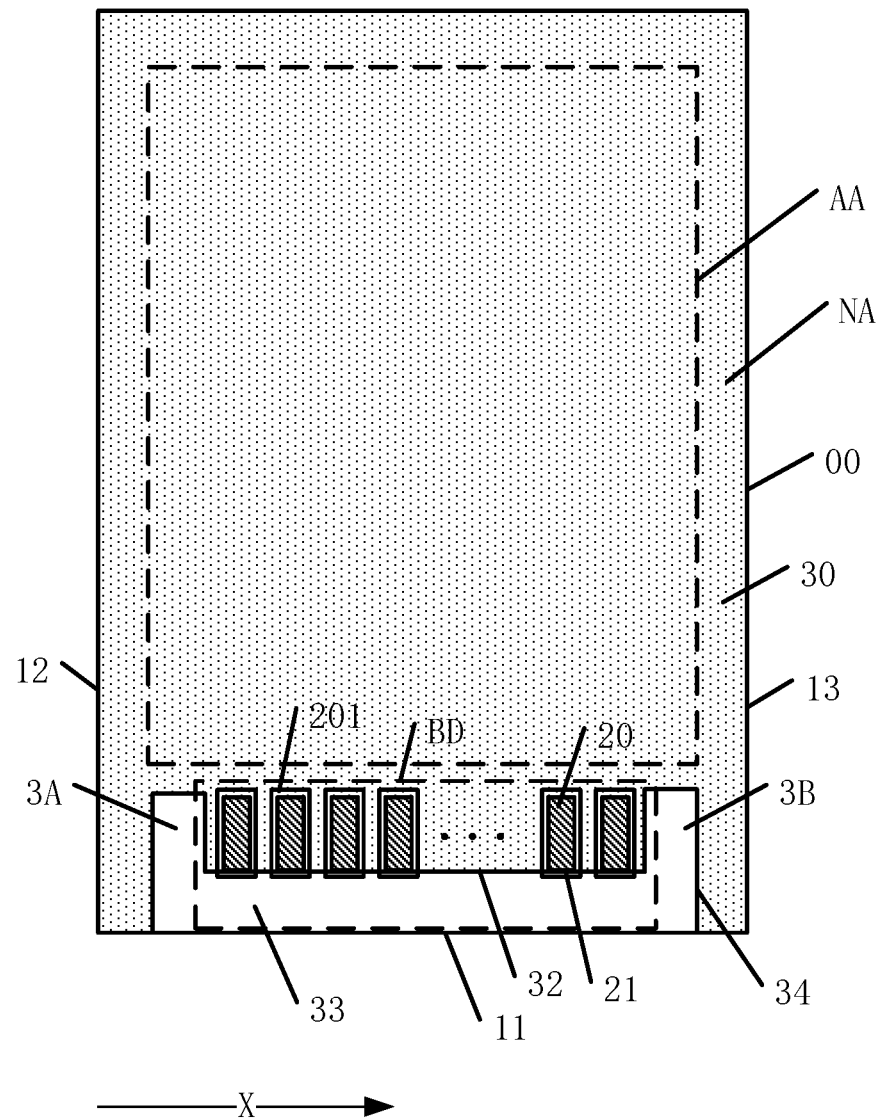
FIG. 10 illustrates a schematic top view of another exemplary display panel consistent with the disclosed embodiments.

FIG. 10 illustrates a schematic top view of another exemplary display panel consistent with the disclosed embodiments. As shown in FIG. 10, in a top view, the groove 33 may be configured with a bottom part and two raised areas 3A and 3B that are arranged at two ends of the bottom part and protruding from the bottom part toward a same direction. The two raised areas 3A/3B may be arranged at opposite sides of the plurality of bonding pads 20 along the first direction X.

In the disclosed embodiments, the groove 33 may be configured with a bottom part and two raised areas 3A and 3B that are arranged at two ends of the bottom part and protruding from the bottom part toward a same direction, the raised area 3A may be arranged between the plurality of bonding pads 20 and the second edge 12, and the raised area 3B may be arranged between the plurality of bonding pads 20 and the third edge 13.

The width of the flexible printed circuit is often larger than the length of the binding area BD in the first direction X, in some embodiments, the length of the groove 33 in the first direction X may also be configured to be greater than the width of the flexible printed circuit. The flexible printed circuit needs to cover the bonding pad 20 after bound to the display panel, i.e., after bound to the display panel, the flexible printed circuit may cover a partial area between the plurality of bonding pads 20 and the second edge 12, and a partial area between the plurality of bonding pads 20 and the third edge 13.

Through configuring the groove 33 with a bottom part and two raised areas 3A and 3B arranged at two ends of the bottom part and protruding from the bottom part toward a same direction where the raised area 3A is arranged between the plurality of bonding pads 20 and the second edge 12 while the raised area 3B is arranged between the plurality of bonding pads 20 and the third edge 13, the flexible printed circuit may be prevented from being bonded to the first insulating layer 30 at both sides of the plurality of bonding pads 20 along the first direction X, such that the contact area of the first insulating layer 30 and the flexible printed circuit may be further reduced. Thus. the phenomenon that the first insulating layer 30 is peeled off may be improved, the phenomenon that the flexible printed circuit is not fixed firmly may be improved, the electrical connection between the flexible printed circuit and the display panel may be improved, and the reliability of the display panel may be enhanced.

Figure 11:
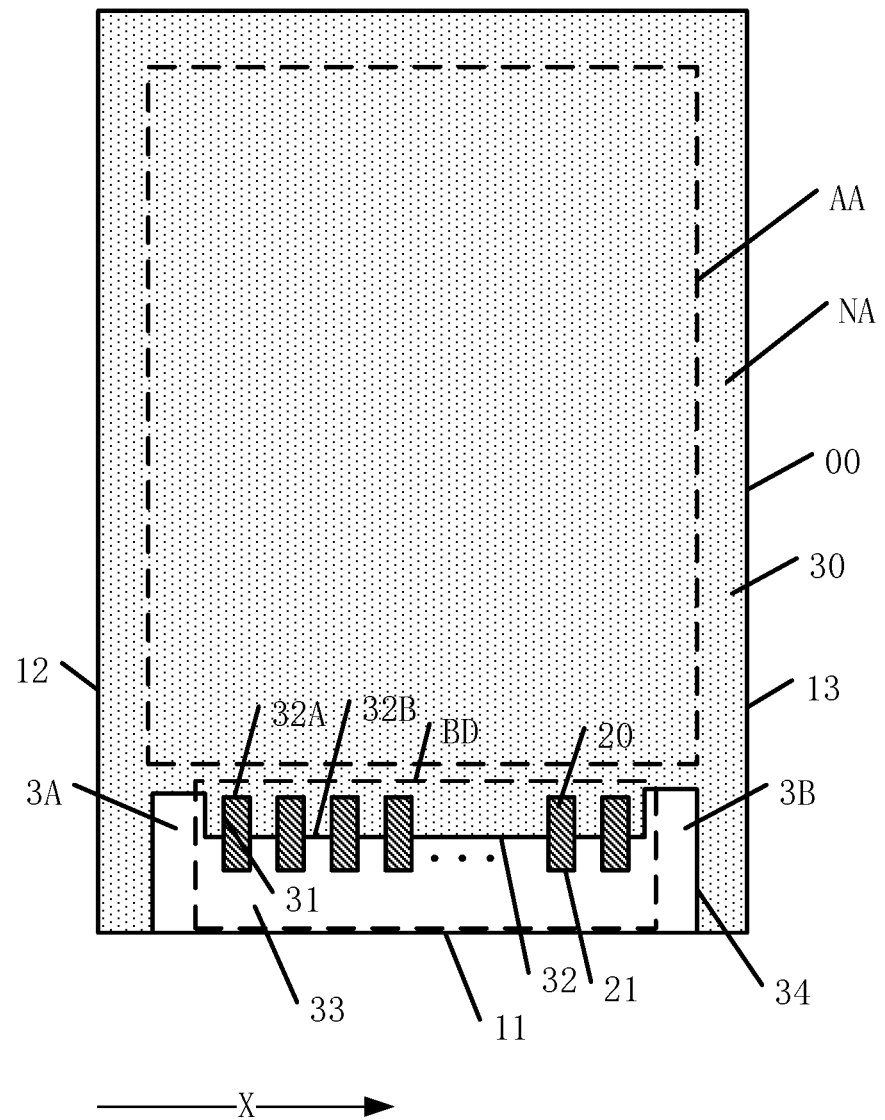
FIG. 11 illustrates a schematic top view of another exemplary display panel consistent with the disclosed embodiments.
Figure 12:
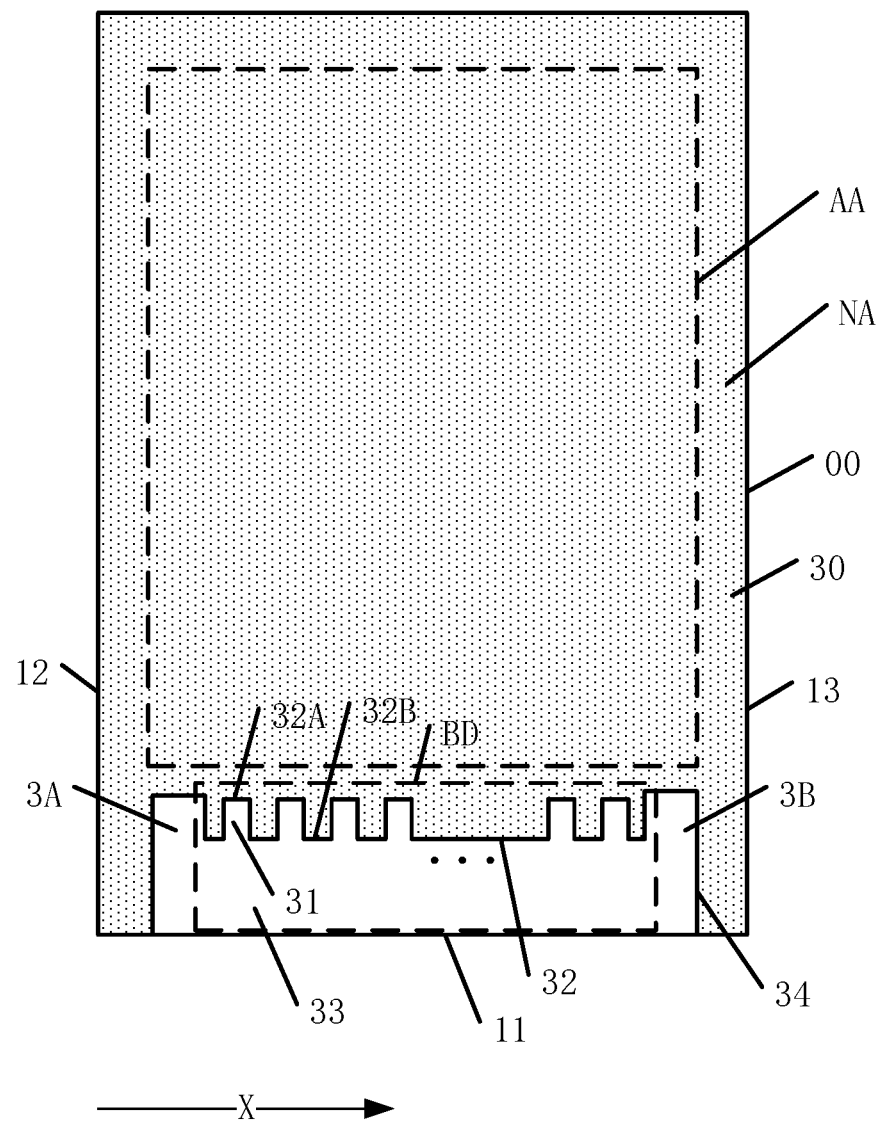
FIG. 12 illustrates a schematic diagram of an exemplary first insulating layer in another exemplary display panel in FIG. 11.

FIG. 11 illustrates a schematic top view of another exemplary display panel consistent with the disclosed embodiments, and FIG. 12 illustrates a schematic diagram of an exemplary first insulating layer in another exemplary display panel in FIG. 11. As shown in FIGS. 11-12, the sub-edge 32 may have a zigzag shape which includes a plurality of alternately arranged raised segments 32A and recessed segments 32B. The raised segment 32A may be recessed toward the display area AA to form a through-hole 31, and the recessed segment 32B may be recessed toward the first edge 11.

In the disclosed embodiments, the sub-edge 32 have a zigzag shape. In particular, the groove 33 and the through-hole 31 may be connected to be a single body so that the sub-edge 32 may be configured with the zigzag shape. The plurality of raised segments 32A may be one-to-one corresponding to the plurality of bonding pads 20. In a direction perpendicular to the plane of the display panel, the raised segment 32A may overlap with the corresponding bonding pad 20, and the recessed segment 32B may be arranged between two adjacent bonding pads 20. Through further retracting the first insulating layer towards the display area AA, the contact area of the first insulating layer 30 and the flexible printed circuit may be further reduced. Thus. the phenomenon that the first insulating layer 30 is peeled off may be improved, the phenomenon that the flexible printed circuit is not fixed firmly may be improved, the electrical connection between the flexible printed circuit and the display panel may be improved, and the reliability of the display panel may be enhanced.

Figure 13:
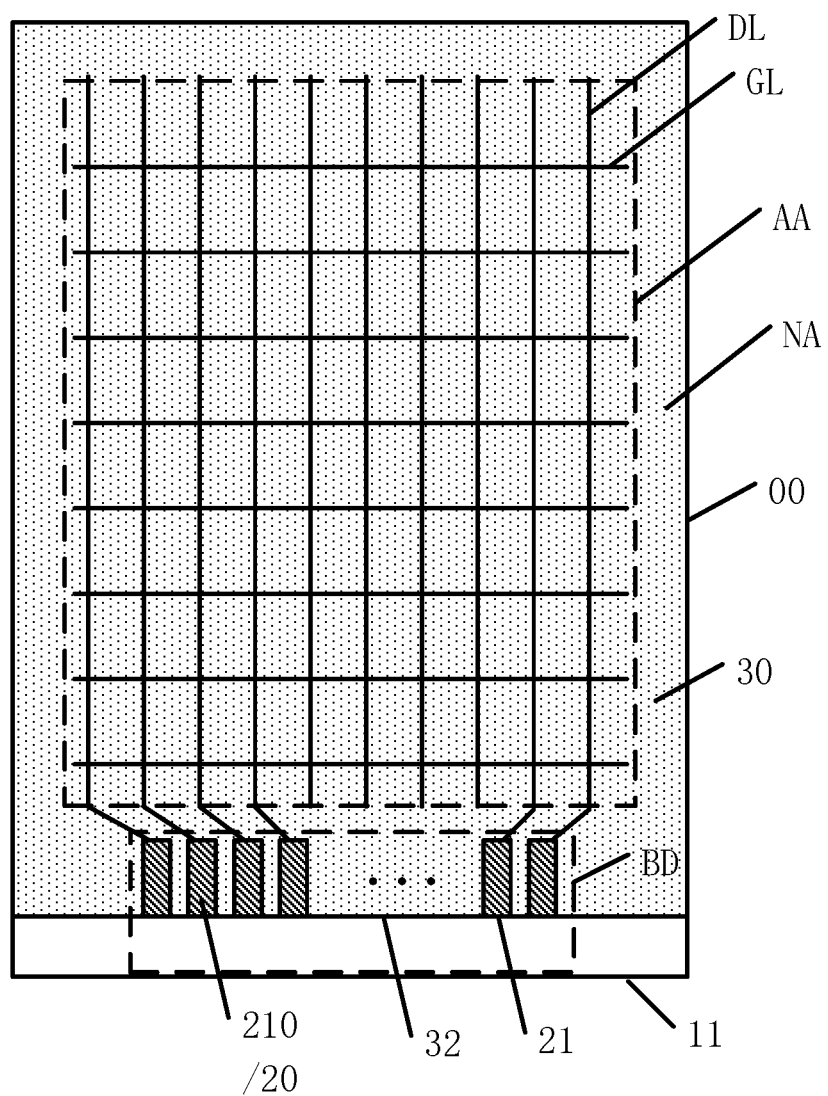
FIG. 13 illustrates a schematic top view of another exemplary display panel consistent with the disclosed embodiments.

In the following, exemplary film layer structures of the display panel will be explained. FIG. 13 illustrates a schematic top view of another exemplary display panel consistent with the disclosed embodiments, and FIG. 14 illustrates a schematic diagram of an exemplary film layer structure of another exemplary display panel in FIG. 13.

Figure 14:
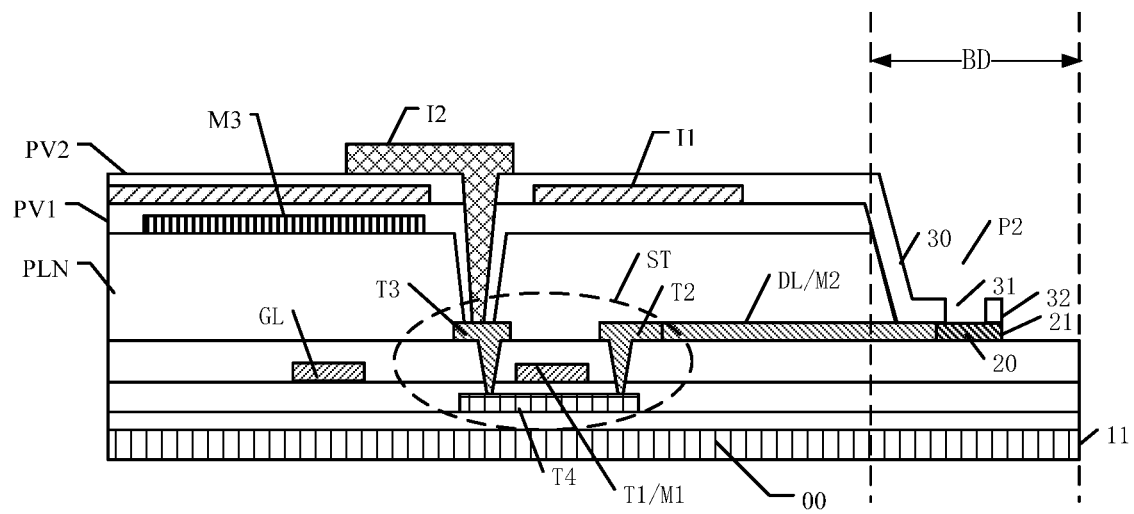
FIG. 14 illustrates a schematic diagram of an exemplary film layer structure of another exemplary display panel in FIG. 13.

As shown in FIGS. 13-14, the display panel may include a base substrate 00, and a plurality of thin film transistors ST disposed on the base substrate 00. Each thin film transistor ST may include a gate electrode T1, a source electrode T2, a drain electrode T3, and a semiconductor portion T4. The gate electrode T1 may be disposed at a first metal layer M1, the source electrode T2 and the drain electrode T3 may be disposed at a second metal layer M2, and the bonding pads 20 may be disposed at the second metal layer M2.

It should be noted that FIG. 14 merely illustrates the film layer structure of the display panel illustrated in FIG. 13 for illustrative purposes, and FIG. 14 is not a view taken along a certain section line in FIG. 13. Further, the display panel may include a plurality of thin film transistors ST, and the number of the thin film transistors ST may be determined according to the actual situation of the display panel. FIG. 14 merely illustrates the film structure of the display panel by taking only one thin film transistor ST as an example.

Further, the display panel may include a plurality of gate lines GL and a plurality of data lines DL. The gate lines GL may be intersecting but electrically insulated from the data lines DL. In the display area AA, the gate line GL and the gate electrode T1 of the thin film transistor ST may be electrically connected, and the data line DL and the source electrode T2 of the thin film transistor ST may be electrically connected. The gate lines GL may be disposed at the first metal layer M1, and the data lines DL may be disposed at the second metal layer M2. The plurality of bonding pads 20 may include a plurality of first bonding pads 210, and the data lines DL and the first bonding pads 210 may be electrically connected.

In the disclosed embodiments, the first bonding pad 210 and the data line DL may be electrically connected for transmitting an electrical signal to the data line DL. In one embodiment, the plurality of bonding pads 20 may further include a plurality of second pads (not drawn) for transmitting an electrical signal to a signal line other than the data line DL.

Further, the second metal layer M2 may have a first side facing the base substrate 00 and an opposing second side. In one embodiment, the display panel may further include a first electrode layer I1 and a second electrode layer I2 disposed at the second side of the second metal layer M2. The display panel may further include a first inorganic layer PV1 disposed between the first electrode layer I1 and the thin film transistor ST, and a second inorganic layer PV2 disposed between the first electrode layer I1 and the second electrode layer I2.

In one embodiment, as shown in FIGS. 13-14, the first electrode layer I1 may be a common electrode layer and the second electrode layer I2 may be a pixel electrode layer. In another embodiment, the first electrode layer I1 may be a pixel electrode layer, and the second electrode layer I2 may be a common electrode layer.

In one embodiment, the display panel may further include a third metal layer M3 disposed between the first inorganic layer PV1 and the second metal layer M2, and a planarization layer PLN disposed between the third metal layer M3 and the second metal layer M2. The planarization layer PLN may include a second hollow P2, and the second hollow P2 may define the binding area BD.

In one embodiment, the display panel may have a touch control function, and the third metal layer M3 may be disposed with touch control signal lines (not drawn).

The planarization layer PLN is often made of an organic material. The planarization layer PLN has a large thickness of the film layer for smoothing the step of the thin film transistor ST layer, and provides a relatively flat surface for forming the third metal layer M3, the first electrode layer I1, the second electrode layer I2, and other film structure. The material of the first inorganic layer PV1 may include silicon nitride and/or silicon oxide, and the material of the second inorganic layer PV2 may include silicon nitride and/or silicon oxide. Silicon nitride and silicon oxide have a dense structure and have good insulating properties.

In one embodiment, the first insulating layer 30 may include at least one of the first inorganic layer PV1 and the second inorganic layer PV2. For illustrative purposes, FIG. 14 shows the first insulating layer 30 includes the second inorganic layer PV2. Further, whether or not the first inorganic layer PV1 and/or the second inorganic layer PV2 extend into the binding area may be designed according to the actual needs of the display panel.

Figure 15:
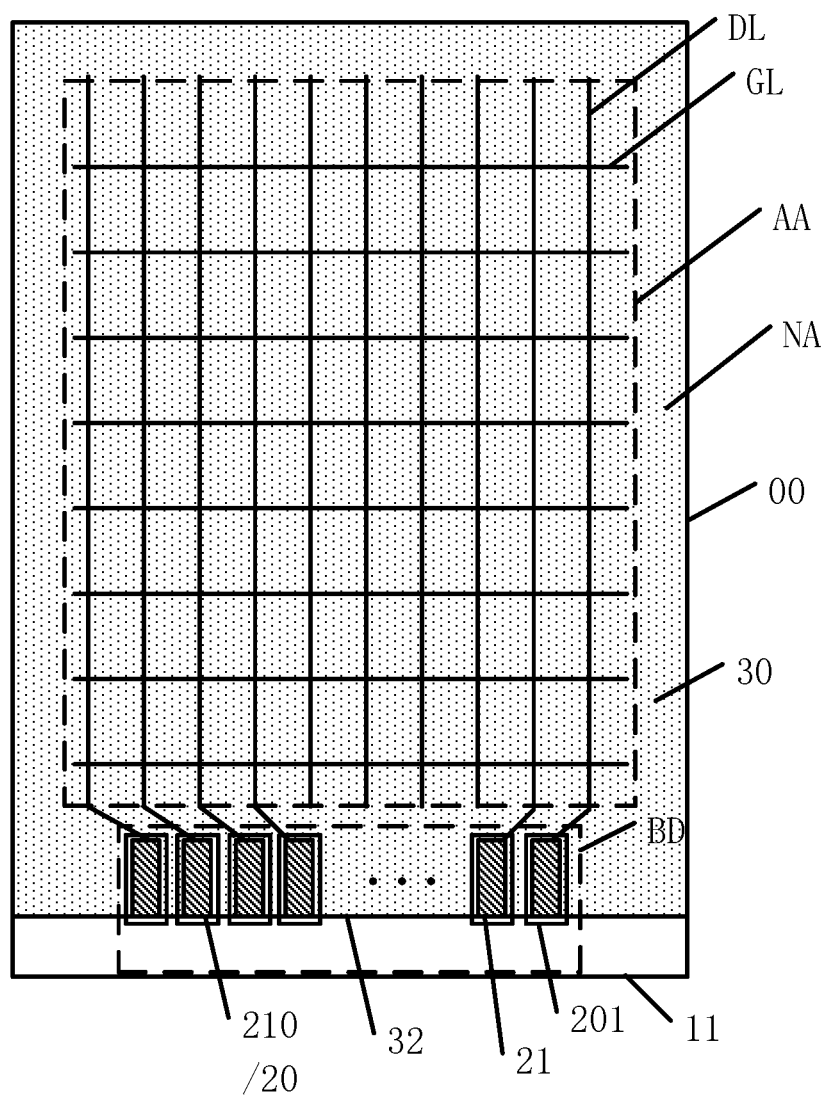
FIG. 15 illustrates a schematic top view of another exemplary display panel consistent with the disclosed embodiments.
Figure 16:
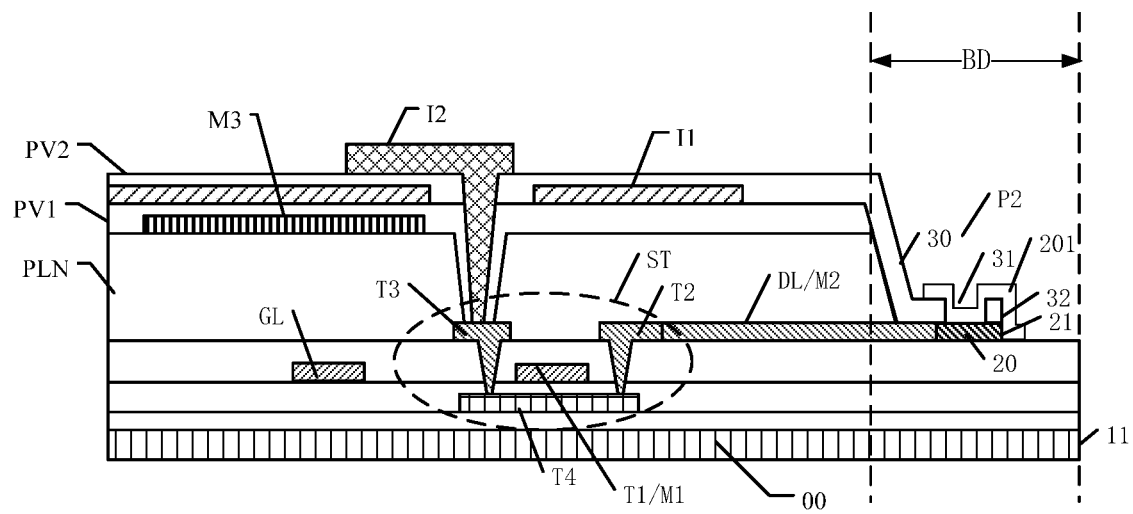
FIG. 16 illustrates a schematic diagram of an exemplary film layer structure of another exemplary display panel in FIG. 15.

FIG. 15 illustrates a schematic top view of another exemplary display panel consistent with the disclosed embodiments, and FIG. 16 illustrates a schematic diagram of an exemplary film layer structure of another exemplary display panel in FIG. 15. The similarities between FIGS. 13-14 and FIGS. 15-16 are not repeated while certain difference may be explained.

As shown in FIGS. 15-16, the binding area BD may include a plurality of conductive portions 201 one-to-one corresponding to a plurality of bonding pads 20, and the conductive portion 201 may be electrically connected to the bonding pad 20 by the through-hole 31. The conductive portion 201 may be disposed at the first electrode layer I1 or the second electrode layer I2.

In the disclosed embodiments, the display panel may include the conductive portion 201 which is electrically connected to the bonding pad 20. On one hand, the conductive portion 201 may serve as a connector to reduce the distance between the flexible printed circuit and the bonding pad 20. On the other hand, due to the excellent electrical connection between the conductive portion 201 and the conductive adhesive, the electrical connection between the flexible printed circuit and the bonding pad 20 may be more reliable.

The bonding pad 20 are often made of a metal material, such as the material of the first metal layer M1, the second metal layer M2 or the third metal layer M3. The conductive portion 201 may be fabricated in a subsequent process of each metal layer, and the first electrode layer I1 and the second electrode layer I2 may be fabricated in the process after forming the third metal layer M3, and the requirements for the fabrication of the conductive portion 201 may be satisfied in the process. Moreover, the first electrode layer I1 and the second electrode layer I2 are often made of a transparent conductive metal oxide material, such as indium gallium zinc oxide (IGZO), indium zinc oxide (IZO), indium tin oxide (ITO), or indium tin zinc oxide (ITZO), etc., which exhibits good electrical connection to the conductive adhesive, thereby meeting the requirements for fabricating the conductive portion 201 in terms of electrical conductivity.

The present disclosure further provides a display device, including any one of the disclosed display panels and a housing for accommodating the display panel.

Figure 17:
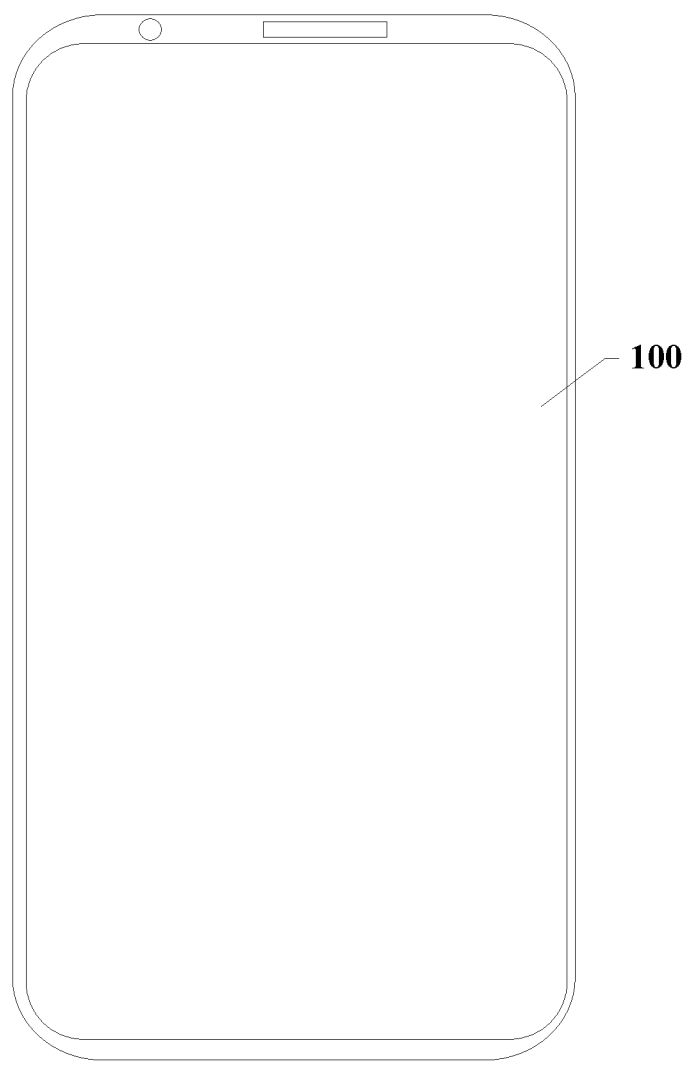
FIG. 17 illustrates a schematic top view of an exemplary display device consistent with the disclosed embodiments.

FIG. 17 illustrates a schematic top view of an exemplary display device 1000 consistent with the disclosed embodiments. As shown in FIG. 17, the display device 1000 may include a display panel 100. The display panel 100 may be any one of the disclosed display panels. FIG. 17 shows the display device 1000 may be a mobile phone, which is for illustrative purposes and is not intended to limit the scope of the present disclosure. The display device 1000 may also be any display device with a display function and/or fingerprint recognition function, such as a laptop, a television, a tablet, and an in-vehicle display device, etc., which is not limited by the present discourse. Because the disclosed display device includes any one of the disclosed display panels, the disclosed display device may also have the same features as the disclosed display panel, and details are not described herein again.

Figure 18:
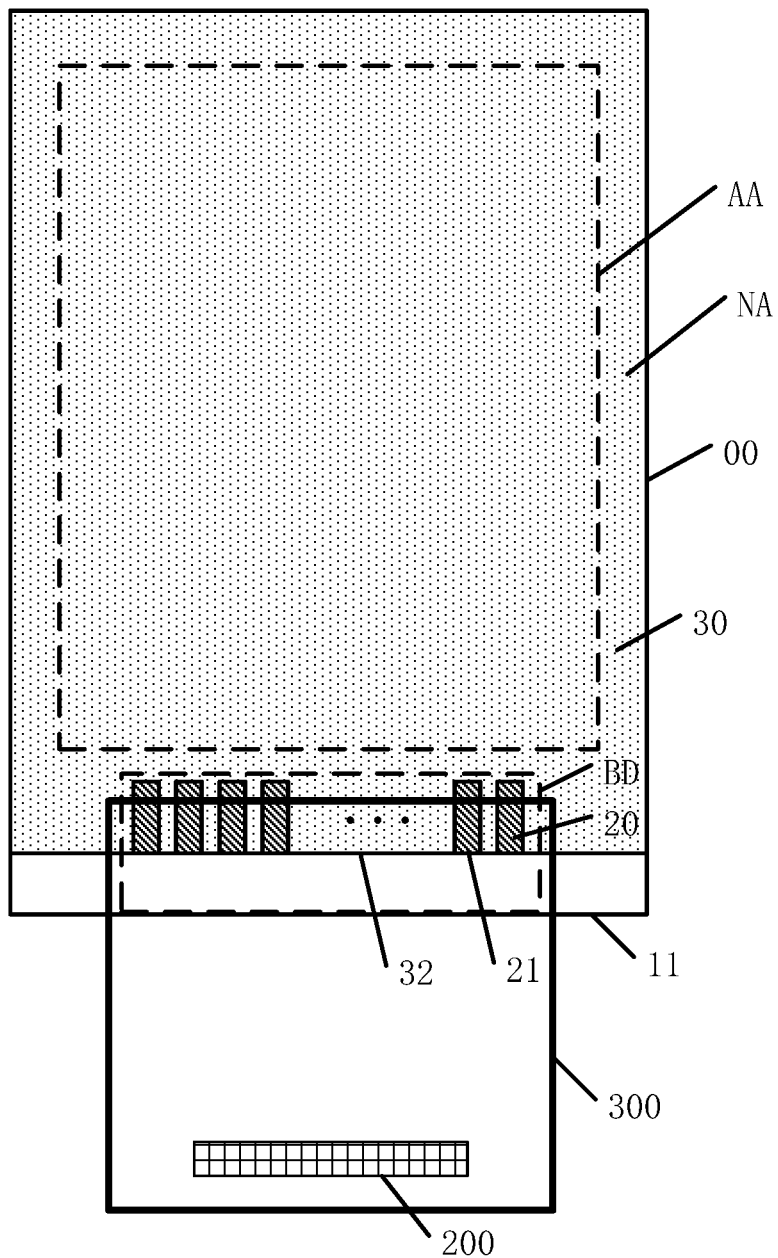
FIG. 18 illustrates a schematic top view of another exemplary display device consistent with the disclosed embodiments.

FIG. 18 illustrates a schematic top view of an exemplary display device consistent with the disclosed embodiments. As shown in FIG. 18, the display device may include a flexible printed circuit (FPC) 300 which is electrically connected to the bonding pads 20 by a conductive adhesive. FPC is a printed circuit board made of flexible insulating substrate. FPC provides excellent electrical performance, which may satisfy the design requirements of small and high-density installation, reduce the assembly process and enhance the reliability. After the flexible printed circuit 300 is bound to the display panel, electrical signals external to the display panel may be transmitted to the bonding pad 20 through the FPC 300, and the bonding pad 20 may transmit the electrical signals to the structure electrically connected thereto.

In one embodiment, the display device may comprise an integrated circuit (IC) 200 which is electrically connected to the FPC 300 by a conductive adhesive. The IC is a miniature electronic device or component that interconnects components, such as transistors, resistors, capacitors, and inductors, and wiring required in a circuit on one or more than one small pieces of semiconductor wafer or dielectric substrate. Then the one or more than one small pieces of semiconductor wafer or dielectric substrate may be encapsulated in a package to become a micro-structure with the required circuit function. The IC 200 has a relatively strong data processing capability. In the disclosed embodiments, the IC 200 may be bound to the FPC 300, such that the electrical signal of the display panel may be processed, and the space of the non-display area of the display panel may be saved, which may facilitate the full screen display.

The conductive adhesive may be an adhesive which has certain conductivity after curing or drying. To clearly illustrate the technical solution of the present disclosure, the conductive adhesive is not drawn in FIG. 18.

In the disclosed embodiments, the display panel may include the first insulating layer which includes the plurality of through-holes to expose at least a portion of the bonding pads. The first insulating layer may be configured with a retracted design. In particular, the first insulating layer may include the sub-edge arranged close to the first edge, and the distance between the sub-edge and the first edge is D1. The bonding pad may have the first bonding pad edge arranged close to the first edge, and the distance between the first bonding pad edge and the first edge is D1, where D1≥D2. That is, the first bonding pad edge and the sub-edge may be flush, or the sub-edge of the first insulating layer may be closer to the display area than the first bonding pad edge of the bonding pad is.

When the display panel is implemented with the COF technology, the contact area of the first insulating layer and the flexible printed circuit may be substantially small as compared to existing technology. Thus, the phenomenon that the first insulating layer is peeled off may be improved, the phenomenon that the flexible printed circuit is not fixed firmly may be improved, the electrical connection between the flexible printed circuit and the display panel may be improved, and the reliability of the display panel may be enhanced.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
    a display area;
    a non-display area surrounding the display area;
    a first edge of the display panel; and
    a first insulating layer,
    wherein the non-display area includes a binding area disposed between the display area and the first edge of the display panel, and the binding area includes a plurality of bonding pads,
    the first insulating layer covers and insulates the plurality of bonding pads and includes a plurality of through-holes disposed at the binding area and one-to-one corresponding the plurality of bonding pads, and each through-hole at least partially exposes a corresponding bonding pad, such that each bonding pad is exposed from the first insulating layer via a corresponding through-hole,
    the first insulating layer includes a sub-edge arranged adjacent to the first edge of the display panel, and a distance between the sub-edge and the first edge of the display panel is D1, and the plurality of bonding pads have a first bonding pad edge arranged adjacent to the first edge of the display panel, and a distance between the first bonding pad edge and the first edge of the display panel is D2, where D1≥D2.

2. The display panel according to claim 1, wherein:
    the binding area includes a plurality of conductive portions disposed on top of the plurality of bonding pads through the plurality of through-holes, each conductive portion being electrically connected the corresponding bonding pad, and
    the plurality of conductive portions are arranged as connectors between a flexible printed circuit and the plurality of bonding pads.

3. The display panel according to claim 2, wherein:
    the conductive portion includes a material of any one of indium gallium zinc oxide (IGZO), indium zinc oxide (IZO), indium tin oxide (ITO), and indium tin zinc oxide (ITZO).

4. The display panel according to claim 1, wherein:
the first insulating layer includes a groove;
the first insulating layer includes an irregular-shaped edge arranged adjacent to the first edge, and the irregular-shaped edge is recessed toward an inside of the display panel to form the groove; and
the irregular-shaped edge includes the sub-edge.

5. The display panel according to claim 4, further comprising:
a second edge and a third edge disposed opposite to each other in a first direction,
wherein the binding area extends along the first direction,
the binding area has a first binding edge adjacent to the second edge and a second binding edge adjacent to the third edge, a distance between the first binding edge and the second edge is L1, and a distance between the second binding edge and the third edge is L2, and
the groove has a first groove edge adjacent to the second edge, and a second groove edge adjacent to the third edge, a distance between the first groove edge and the second edge is L3, and a distance between the second groove edge and the third edge is L4, where L1<L3 and L2<L4.

6. The display panel according to claim 5, wherein:
in a top view, the groove has a bottom part and two raised areas that are arranged at two ends of the bottom part and protruding from the bottom part toward a same direction, and
the raised areas are arranged at opposite sides of the plurality of bonding pads along the first direction.

7. The display panel according to claim 5, wherein:
in a top view, the groove has a rectangular shape.

8. The display panel according to claim 1, further comprising:
a base substrate and a plurality of thin film transistors disposed on the base substrate,
wherein a thin film transistor includes a gate electrode, a source electrode and a drain electrode, and
the gate electrode is disposed at a first metal layer, the source electrode and the drain electrode are disposed at a second metal layer, and the bonding pad is disposed at the second metal layer.

9. The display panel according to claim 8, further comprising:
a plurality of gate lines disposed at the first metal layer; and
a plurality of data lines disposed at the second metal layer
wherein the plurality of bonding pads include a plurality of first bonding pads, and a data line is electrically connected to a first bonding pad.

10. The display panel according to claim 8, wherein:
the second metal layer has a first side facing the base substrate and an opposing second side, and the display panel further comprises:
a first electrode layer and a second electrode layer disposed at the second side of the second metal layer,
a first inorganic layer disposed between the first electrode layer and the thin film transistor, and
a second inorganic layer disposed between the first electrode layer and the second electrode layer.

11. The display panel according to claim 10, wherein:
the first insulating layer includes at least one of the first inorganic layer and the second inorganic layer.

12. The display panel according to claim 10, further comprising:
a third metal layer disposed between the first inorganic layer and the second metal layer; and
a planarization disposed between the third metal layer and the second metal layer,
wherein the planarization layer includes a second hollow which defines the binding area.

13. The display panel according to claim 10, wherein:
the binding area includes a plurality of conductive portions one-to-one corresponding to the plurality of bonding pads,
a conductive portion is electrically connected to the corresponding bonding pad via the through-hole, and
the conductive portion is disposed at one of the first electrode layer and the second electrode layer.

14. The display panel according to claim 10, wherein:
the first inorganic layer includes a material of at least one of silicon nitride and silicon oxide; and
the second inorganic layer includes a material of at least one of silicon nitride and silicon oxide.

15. The display panel according to claim 1, wherein:
the sub-edge has a zigzag shape which includes a plurality of alternately arranged raised segments and recessed segments,
wherein a raised segment is recessed towards the display area to form the through-hole, and a recessed segment is recessed toward the first edge.

16. A display device, comprising:
a display panel, wherein the display panel comprises:
a display area;
a non-display area surrounding the display area;
a first edge of the display panel; and
a first insulating layer,
wherein the non-display area includes a binding area disposed between the display area and the first edge of the display panel, and the binding area includes a plurality of bonding pads,
the first insulating layer covers and insulates the plurality of bonding pads and includes a plurality of through-holes disposed at the binding area and one-to-one corresponding the plurality of bonding pads, and each through-hole at least partially exposes a corresponding bonding pad, such that each bonding pad is exposed from the first insulating layer via a corresponding through-hole,
the first insulating layer includes a sub-edge arranged adjacent to the first edge of the display panel, and a distance between the sub-edge and the first edge of the display panel is D1, and the plurality of bonding pads have a first bonding pad edge arranged adjacent to the first edge of the display panel, and a distance between the first bonding pad edge and the first edge of the display panel is D2, where D1≥D2.

17. The display device according to claim 16, wherein:
the binding area includes a plurality of conductive portions disposed on top of the plurality of bonding pads through the plurality of through-holes, each conductive portion being electrically connected the corresponding bonding pad, and
the plurality of conductive portions are arranged as connectors between a flexible printed circuit and the plurality of bonding pads.

18. The display device according to claim 17, wherein:
the flexible printed circuit is electrically connected to the bonding pads by a conductive adhesive and based on the plurality of conductive portions.

19. The display device according to claim 18, further comprising:
   an integrated circuit electrically connected to the flexible printed circuit by the conductive adhesive.

* * * * *